(12) United States Patent
Delapierre

(10) Patent No.: US 7,161,233 B2
(45) Date of Patent: Jan. 9, 2007

(54) INTEGRATED MICRO ELECTROMECHANICAL SYSTEM ENCAPSULATION COMPONENT AND FABRICATION PROCESS OF THE COMPONENT

(75) Inventor: Gilles Delapierre, Seyssins (FR)

(73) Assignee: Commissariat a l'Energie Atomique, Paris (FR)

( * ) Notice: Subject to any disclaimer, the term of this patent is extended or adjusted under 35 U.S.C. 154(b) by 419 days.

(21) Appl. No.: 10/725,084

(22) Filed: Dec. 2, 2003

(65) Prior Publication Data
US 2004/0161870 A1 Aug. 19, 2004

(30) Foreign Application Priority Data
Dec. 20, 2002 (FR) ................... 02 16274

(51) Int. Cl.
*H01L 23/02* (2006.01)
(52) U.S. Cl. ...................... 257/680; 257/434

(58) Field of Classification Search ............ None
See application file for complete search history.

(56) References Cited
FOREIGN PATENT DOCUMENTS

| EP | 1 070 677 A2 | 1/2001 |
|---|---|---|
| EP | 1 071 126 A2 | 1/2001 |
| EP | 1 167 281 A2 | 1/2002 |
| WO | WO 01/29529 A2 | 4/2001 |

*Primary Examiner*—Leonardo Andujar
(74) *Attorney, Agent, or Firm*—Oliff & Berridge, PLC

(57) ABSTRACT

The component comprises micro electromechanical systems integrated in a cavity of a substrate and a cover sealed onto the substrate and designed to make the cavity hermetic. The cover comprises at least one groove passing through the cover and defining a central zone completely covering the cavity and a peripheral zone in the cover. A sealing material is deposited at least at the bottom of the groove. Fabrication of the component can comprise a first stage of making at least one groove in the cover, a second stage of bringing the substrate and cover into contact, and a third stage of sealing by depositing a sealing material in the bottom of the groove.

16 Claims, 5 Drawing Sheets

INTEGRATED MICRO ELECTROMECHANICAL SYSTEM ENCAPSULATION COMPONENT AND FABRICATION PROCESS OF THE COMPONENT

BACKGROUND OF THE INVENTION

The invention relates to a component for encapsulation of micro electromechanical systems integrated in a cavity, comprising a substrate wherein the cavity is formed, a cover presenting a front face and a rear face, arranged on the substrate, and means for sealing the cover onto the substrate designed to make the cavity hermetic.

STATE OF THE ART

The Micro ElectroMechanical Systems (MEMS) technology has undergone considerable development in the course of the last few years. The best known applications are accelerometers for airbags, gyrometers for navigation and radio-frequency and optical switches for telecoms.

In order to reduce fabrication costs, it is sought to increasingly apply the principle of collective fabrication, on which the whole power of microtechnologies relies extensively. Thus, it is sought to fabricate the smallest chips possible so as to have as many of chips as possible on a single substrate.

Collective fabrication is all the more interesting as it comprises all the fabrication stages. However, certain stages of fabrication are performed collectively whereas other stages are performed individually on each chip. The sealing stage for example is very costly if it is performed on each individual chip after the latter have been cut out from the substrate.

As represented in FIG. 1, a current MEMS is typically formed by a substrate 1 and micro electromechanical systems 2 integrated in a cavity of the substrate 1. In order to protect the micro-systems, a cover 3 is fixed onto the substrate 1 by sealing means designed to make the cavity hermetic.

Processes are sought to be developed presenting the following features:
collective on wafer,
consuming little silicon surface (to reduce the size of the chips),
ability to guarantee a very good long-lasting hermeticity in harsh temperature and humidity environments,
generating little stray strain,
flexibility as far as the design of the MEMS itself is concerned,
preferably able to be fabricated at low temperature (<450° C.).

None of the techniques known to date enables all these conditions to be met at the same time.

A first known technique consists in sealing a cover by a bead made of polymer material. The advantage of this solution is that the shape of the bead can be defined by photolithography techniques which enable beads of very small width to be achieved (a few tens of micrometers), consuming little chip surface. Sealing can moreover be performed by simple means at low temperature. The major drawback is that it is impossible to guarantee a very good hermeticity with a polymer, notably to vacuum. Polymers are furthermore not very resistant to aggressions from the environment.

A second technique, widely used nowadays, consists in using a molten glass bead deposited by silk screen process. Glasses melting at 450° C. can be found and this technique ensures a good hermeticity. It does however present the great drawback of leading to beads of very great width (a few hundreds of micrometers) which becomes unacceptable for large-scale distribution products. For example, the surface of the chips for an acceleration sensor of the next generation will be about one square millimeter. But the width of the bead is linked to the glass paste deposition technique by silk screen process and it is therefore difficult to hope to reduce this width.

A third, more integrated technique consists in replacing the cover by a deposited thin film. A process of this type typically involves deposition of a sacrificial layer, deposition of the thin film acting as cover, and removal of the sacrificial layer. The cover layer is often made of polycrystalline silicon, a material sometimes also used for the MEMS itself. This technique presents the advantage of a very large miniaturization and therefore a very low potential cost. It uses mineral sealing, which is therefore hermetic. A large drawback is however that the cover must be deposited before the sacrificial layer for mechanical release of the MEMS is etched. The cover layer can in fact not be deposited in air. Release etching of the cover therefore has to be performed through holes in the cover, which is very complicated and requires a very special design of the MEMS. This constraint greatly reduces the freedom of design of the MEMS itself. Another drawback is the small thickness of the cover (a few micrometers), which in certain cases can be deformed due to the effect of the external pressure.

OBJECT OF THE INVENTION

The object of the invention is to overcome these drawbacks and more particularly to propose a process for fabricating integrated micro electromechanical systems minimizing the problems of collective fabrication, size, hermeticity, thermal expansion and solidity of the cover, while reducing the MEMS design constraints and fabrication cost.

According to the invention, this object is achieved by the fact that the cover comprises at least one groove passing through the cover and defining in the cover a peripheral zone and a central zone completely covering the cavity, a sealing material being deposited at the bottom of the groove.

Another object of the invention is to achieve a process for fabricating a component wherein sealing is performed by:
a first stage of making in the cover at least one groove passing through the cover and defining a central zone and a peripheral zone in the cover,
a second stage of bringing the substrate and cover into contact so that the central zone completely covers a cavity of the substrate,
a third stage of sealing by depositing a sealing material at the bottom of the groove.

According to another process for fabricating a component according to the invention, sealing is achieved by:
a first stage of making in the front face of the cover (3) at least one groove (9) having a depth smaller than the thickness of the cover (3) and defining a central zone (6) and a peripheral zone (7) in the cover (3),
a second stage of at least partial filling of the groove (9) with glass powder and melting of the glass (4),
a third stage of removing a sufficient thickness from the rear face of the cover (3) to uncover the glass contained in the groove (9), a fourth stage of bringing the substrate (1) and cover (3) into contact so that the central zone (6) completely covers the cavity of the substrate, and of sealing by melting of the glass (4).

DESCRIPTION OF THE DRAWINGS

Other advantages and features will become more clearly apparent from the following description of particular embodiments of the invention given as non-restrictive examples only and represented in the accompanying drawings, in which.

DETAILED DESCRIPTION OF PARTICULAR EMBODIMENTS

Figure 1:
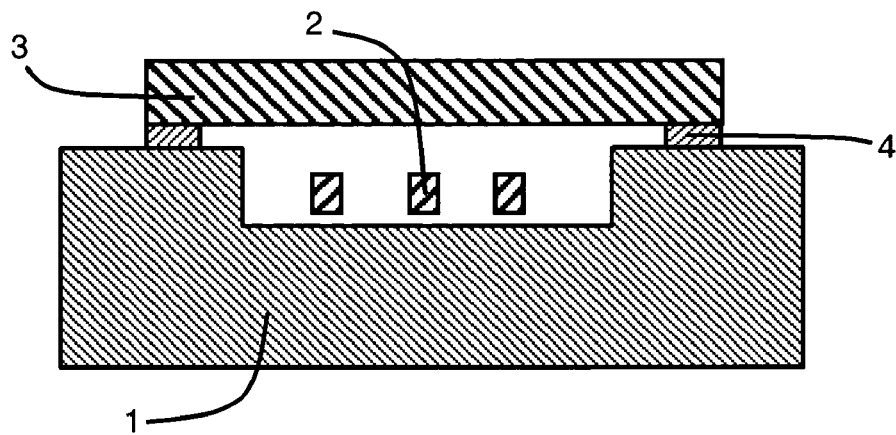
FIG. 1 represents a cross-sectional view of a component comprising integrated micro electromechanical systems according to the prior art.
Figure 2:
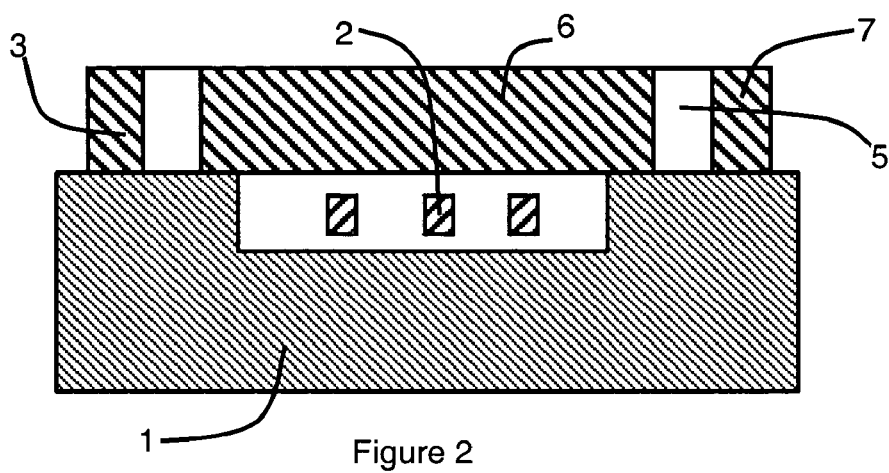
FIGS. 2 and 3 represent two stages of a particular embodiment of a process according to the invention.

FIG. 2 represents a component comprising a substrate 1 and micro electromechanical systems 2 integrated in a cavity on the top face of the substrate 1. The cover 3, arranged with its rear face on the substrate 1, comprises at least one groove 5, for example annular, passing through the cover 3 and defining in the cover 3 a peripheral zone 7 and a central zone 6 completely covering the cavity.

Figure 3:
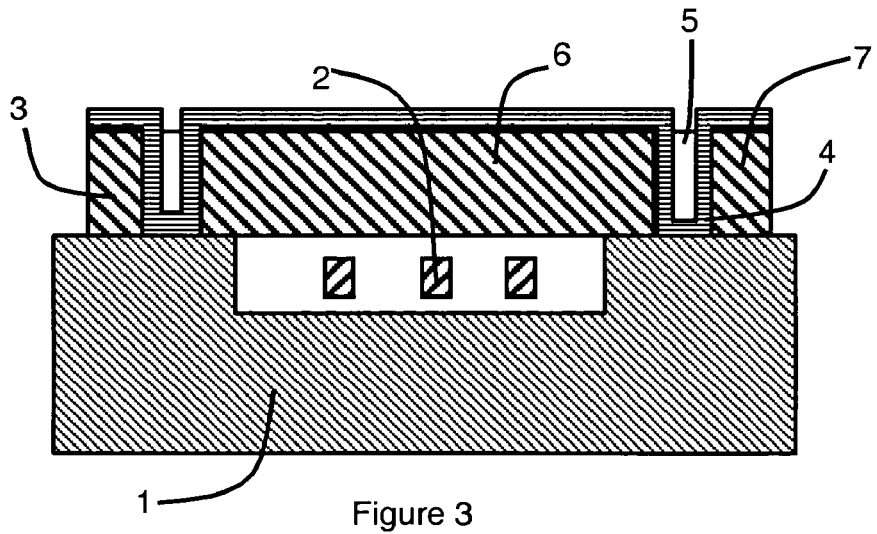

To make the cavity hermetic, a sealing material 4 is deposited at least at the bottom of the groove 5. In FIG. 3, a layer of sealing material 4 is deposited on the front face of the cover 3, covering the whole of this front face, the walls and the bottom of the groove 5. The cover 3 can comprise additional grooves (not shown) in the central zone 6 enabling additional sealings to be performed on pads arranged in the cavity facing the additional groove.

The groove 5 is not necessarily circular. It may have internal and external perimeters that are square, circular or of more complex shape, the essential thing being that the groove form a closed loop so that the sealing material 4 surrounds the cavity completely in order to achieve tightness.

Figure 4:
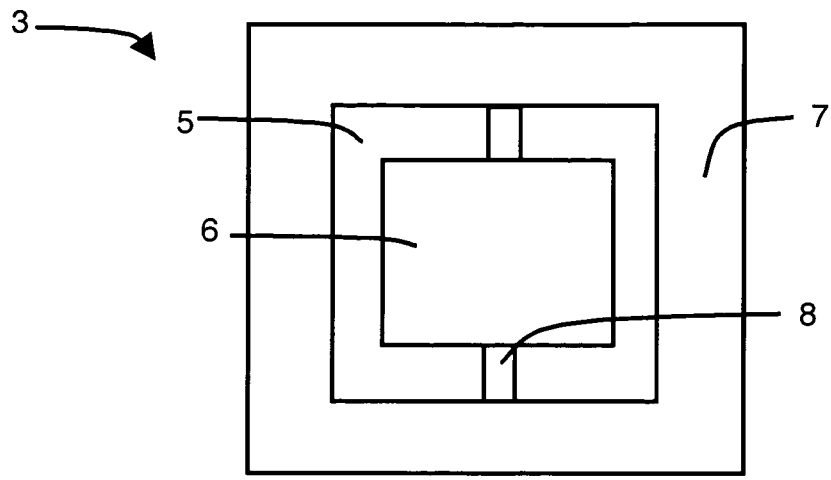
FIGS. 4 and 5 represent a particular embodiment of a cover according to the invention respectively in bottom view and top view.
Figure 5:
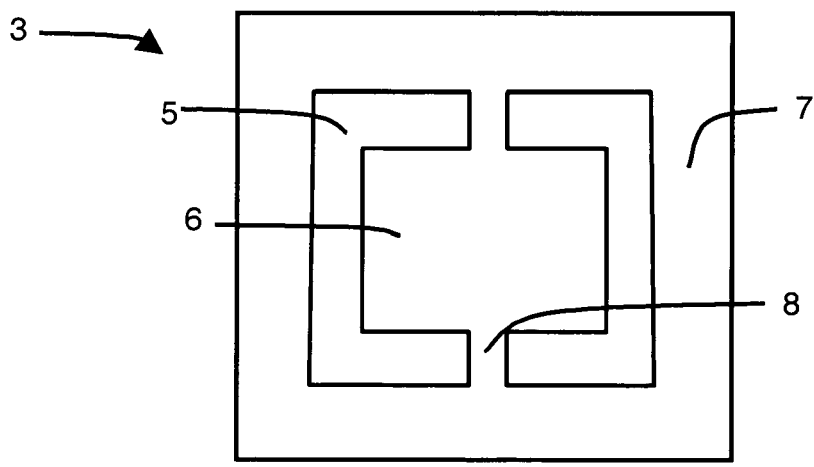

FIGS. 4 and 5 represent a groove the internal and external perimeters whereof are square. The central zone 6 can be joined to the peripheral zone 7, on the front face of the cover, by arms 8 securely fixed to the cover. These arms can be obtained by etching of the non-emergent grooves on the rear face of the cover, and then by etching of the rear face to define the shape of the arms 8. Thus, on the rear face of the cover, the groove 5 forms a full loop (FIG. 4), whereas on the front face this loop is interrupted by the arms 8 (FIG. 5).

The sealing material 4 can be mineral, metallic or insulating. A sealing can also comprise several layers of different materials. The main processes able to be used for introducing the sealing material 4 into the grooves 5 are chemical vapor deposition (CVD) and deposition of a layer of molten glass.

Vacuum evaporation can also be envisioned. Its directivity does however complicate the deposition process due to shadowing effects and it is then necessary to vary the orientation of the substrates well during deposition (well known use of planetaries) for all the useful zones to be covered.

The sealing material deposited by CVD can be chosen from the most conventional materials used in microelectronics processes: silicon oxide, silicon nitride, polysilicon, tungsten, etc. Among all the CVD type processes, low pressure chemical vapor deposition (LPCVD) is particularly suitable as it presents a good covering power in the grooves. It can however require high temperatures which, in certain cases, are not acceptable. A possible low temperature variant is plasma enhanced tetra-ethyl-ortho-silicate chemical vapor deposition (PETEOS CVD) which offers a good compromise between layer quality, conformity of the layer to the substrate and deposition temperature (below 450° C.).

At the moment of sealing, the substrate 1 and cover 3 must be sufficiently close to one another (a few micrometers) for the deposited layer to achieve tightness. An electrical voltage can be applied for this purpose between the substrate 1 and cover 3 to bring them into contact by electrostatic forces.

Figure 6:
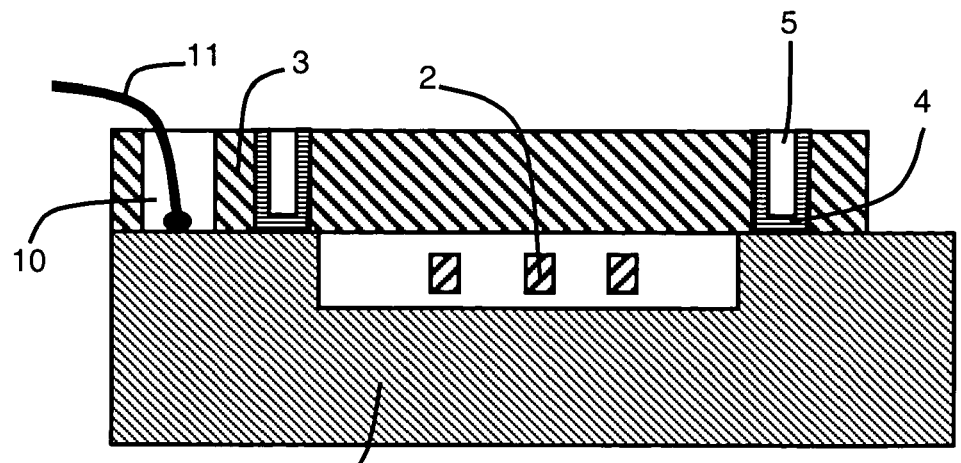
FIGS. 6 and 7 represent two stages of a particular embodiment of a process according to the invention enabling connection of the substrate.
Figure 7:
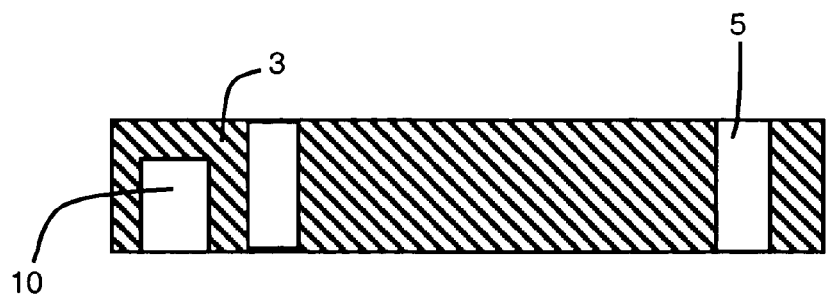

As represented in FIG. 6, the peripheral zone 7 of the cover 3 can comprise at least one hole 10 passing through the cover 3 and through which a wire 11 passes for electrical connection to the substrate 1. To prevent plugging of the hole 10 during deposition of the sealing material 4, a hole 10 with a depth smaller than the initial thickness of the cover 3 can be machined in the rear face of the cover 3 (FIG. 7). Thus, during deposition of the sealing material, the hole 10 is protected by the cover 3. After deposition, the cover 3 is thinned on its front face so as to uncover the hole 10. The wire 11 for connection to the substrate 1 can then be fitted.

Figure 8:
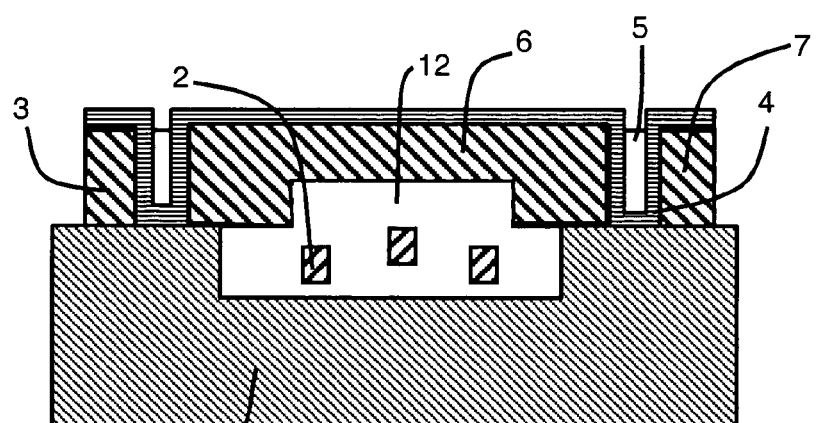
FIG. 8 is a representation of a particular embodiment of a component according to the invention wherein the cover comprises a cavity.

FIG. 8 shows a particular embodiment wherein the central zone 6 of the cover 3 comprises an additional cavity 12 on the rear face of the cover enabling the useful space of the integrated micro electromechanical systems 2 to be increased.

Figure 9:
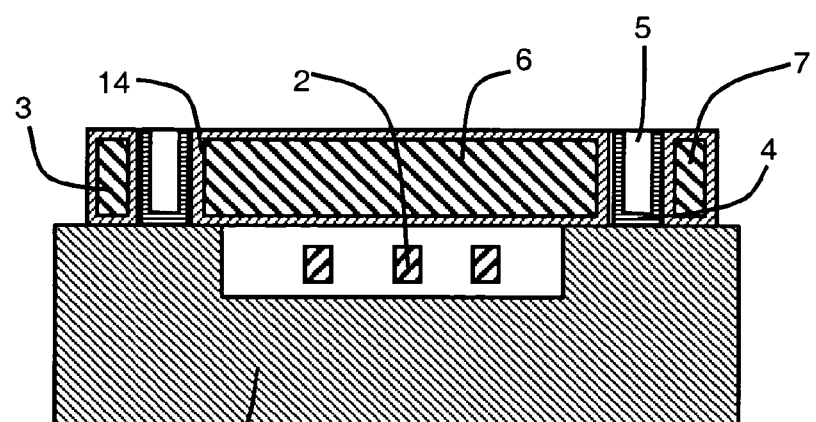
FIG. 9 is a representation of a particular embodiment of a component according to the invention wherein the cover comprises an insulating layer.
Figure 10:
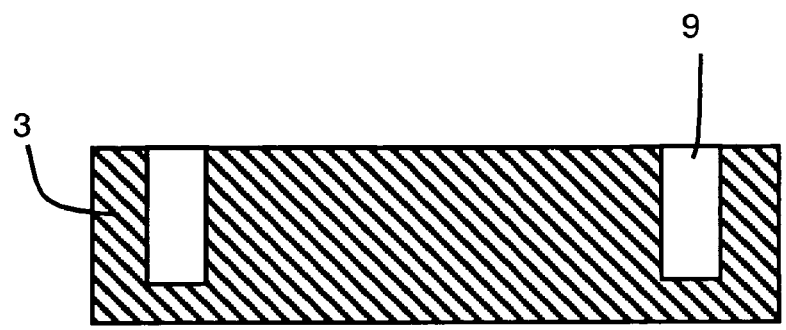
FIGS. 10 to 13 represent different stages of a particular embodiment of a process according to the invention.

As represented in FIG. 9, the cover 3 can comprise an insulating layer 14 in the grooves 5 and on the front and rear faces so as to electrically insulate the cover 3 from the sealing material 4. The insulating layer 14 can be deposited around the central zone 6 and peripheral zone 7 of the cover after the grooves 5 have been made. A known means for achieving the insulating layer 14 is thermal oxidation of the cover 3. The sealing material 4, if it is electrically conducting, can then act as electrical inter-connection between the substrate 1 and elements arranged on the cover 3.

Sealing of a component according to FIG. 3 is illustrated in FIGS. 2 and 3. A first stage consists in making at least one groove 5 in the cover 3, the groove passing through the cover 3 and defining a central zone 6 and a peripheral zone 7 in the cover 3, as represented in FIG. 2. Machining of the grooves of the required sealing width is performed in known manner, typically by reactive ion etching of the cover material, typically silicon. A second stage consists in bringing the substrate 1 and the cover 3 into contact so that the central zone 6 is located facing the cavity of the substrate so as to cover the latter completely, as represented in FIG. 2. Then, in a third stage, represented in FIG. 3, the sealing material 4 is deposited at least at the bottom of the groove 5. Then the different chips are cut off.

Figure 11:
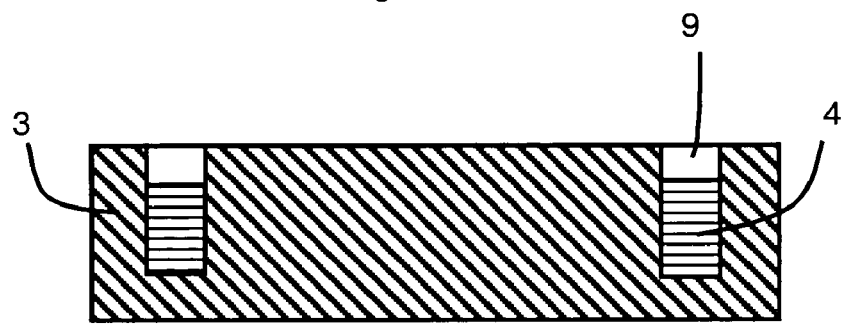
Figure 12:
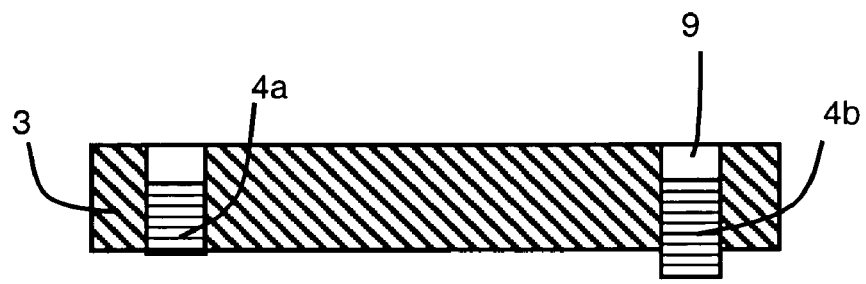
Figure 13:
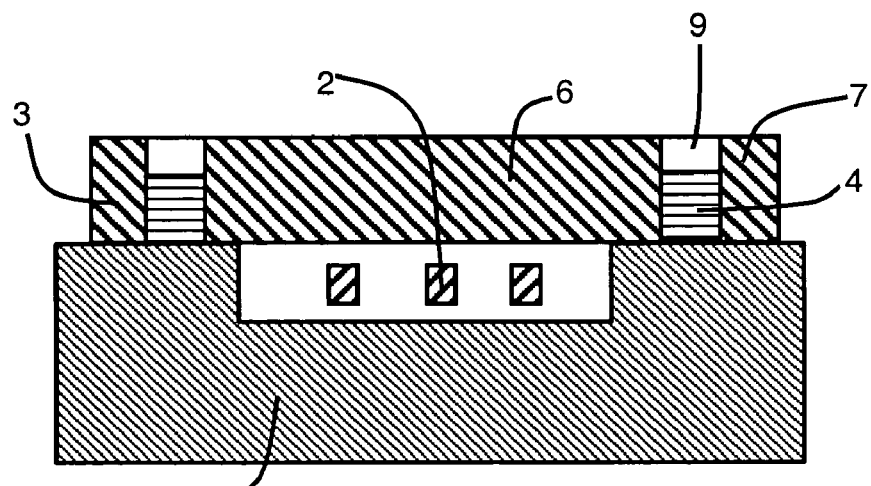

In the case of sealing with molten glass, another embodiment represented in FIGS. 10 to 13 can be envisioned. A first stage then consists in making, in the front face of the cover 3, at least one groove 9 having a depth smaller than the thickness of the cover 3. The cover therefore has to have a larger thickness than the final thickness required. Then, as represented in FIG. 11, the groove 9 is at least partly filled with glass powder and the glass is heated to make the glass 4 melt in the groove 9. A third stage, represented in FIG. 12, consists in removing a sufficient thickness from the rear face of the cover 3 to uncover the glass 4a contained in the groove 9. Then, in a fourth stage, represented in FIG. 13, the substrate 1 and cover 3 are brought into contact and the sealing stage is performed by melting of the glass 4. In this process variant, an additional stage can consist in selective etching of the rear face of the cover 3 between the third and fourth stages so that the glass 4 contained in the groove is salient as represented in 4b. When the sealing stage is performed, this salient part spreads over a slightly larger width than the width of the groove 5.

CVD and molten glass can also be combined, a first thin film being deposited by CVD to ensure a minimum mechanical strength and the molten glass then being poured into the grooves to achieve perfect tightness.

Figure 14:
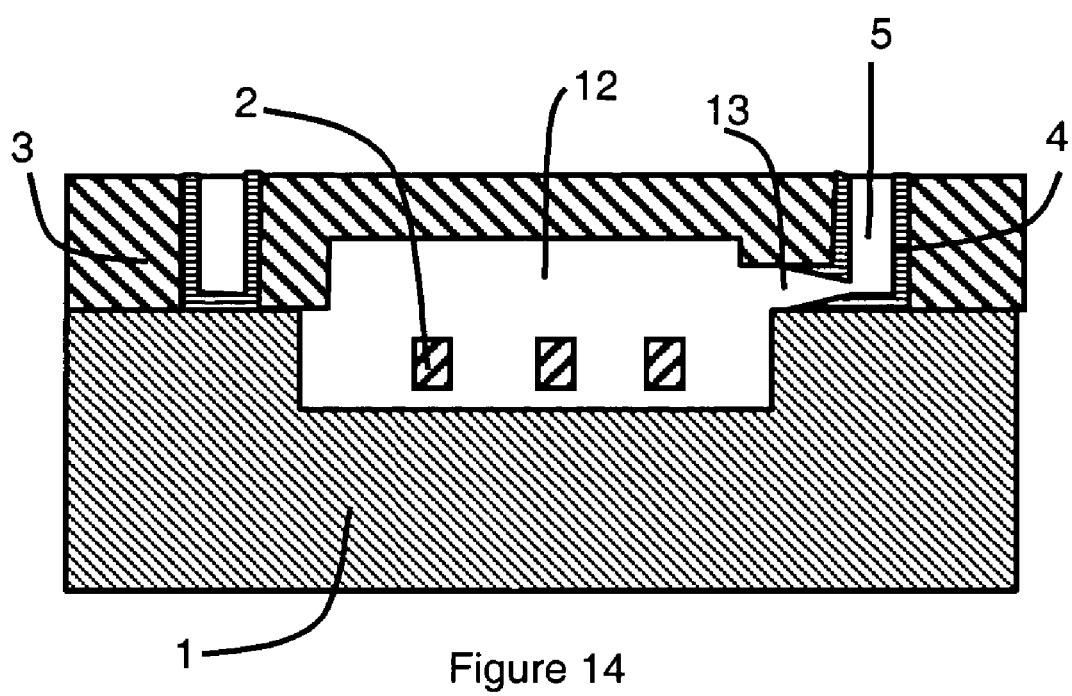
FIG. 14 is a representation of a particular embodiment of a component according to the invention wherein the cover comprises a groove.

FIG. 14 represents a component with a cover comprising a channel 13 between a cavity 12 and a groove 5. The channel 13 is dug in the rear face of the cover 3 before the stage of bringing the substrate 1 and cover 3 into contact. Thus, when sealing deposition is performed (by CVD for example), the channel locally prevents complete plugging so as to leave a passage between the cavity and the groove. This enables plugging to be performed subsequently in a controlled atmosphere.

In another embodiment, a stage of making a hole in the cover is added, also enabling plugging to be performed subsequently in a controlled atmosphere. Plugging can be achieved by any known means such as sealing of an additional substrate, melting of a tin and lead pellet or molten glass.

The invention claimed is:

1. A component for encapsulation of micro electromechanical systems integrated in a cavity, comprising a substrate in which the cavity is formed, a cover presenting a front face and a rear face, arranged on the substrate, and means for sealing the cover onto the substrate designed to make the cavity hermetic, said means for sealing comprising a seal formed by a sealing material deposited at a bottom of at least one groove passing through the cover and delineating in the cover a peripheral zone and a central zone completely covering the cavity, the groove forming a closed loop at least on the rear face of the cover.

2. Encapsulation component according to claim 1, wherein the central zone is joined to the peripheral zone, on the front face of the cover, by arms securely fixed to the cover.

3. Encapsulation component according to claim 1, wherein the cover comprises at least one additional groove in the central zone.

4. Encapsulation component according to claim 1, wherein the peripheral zone of the cover comprises at least one hole passing through the cover through which hole a wire passes for electrical connection to the substrate.

5. Encapsulation component according to claim 1, wherein the sealing material comprises a layer of molten glass.

6. Encapsulation component according to claim 1, wherein the cover comprises an insulating layer deposited in the at least one groove so as to electrically insulate the sealing material from the cover.

7. Encapsulation component according to claim 1, wherein the central zone of the cover comprises at least one additional cavity on the rear face of the cover.

8. A fabrication process of the encapsulation component according to claim 1, comprising:
    a first stage of making in the cover at least one groove passing through the cover and delineating a central zone and a peripheral zone in the cover,
    a second stage of bringing the substrate and cover into contact so that the central zone completely covers a cavity of the substrate,
    a third stage of sealing by depositing a sealing material at the bottom of the groove.

9. Fabrication process according to claim 8, wherein deposition of the sealing material comprises deposition of a thin film.

10. Fabrication process according to claim 9, wherein deposition of the thin film is performed by a CVD process.

11. Fabrication process of the encapsulation component according to claim 1, comprising:
    a first stage of making in the front face of the cover at least one groove having a depth smaller than the thickness of the cover and delineating a central zone and a peripheral zone in the cover,
    a second stage of at least partial filling of the groove with glass powder and melting of the glass,
    a third stage of removing a sufficient thickness from the rear face of the cover to uncover the glass contained in the groove,
    a fourth stage of bringing the substrate and cover into contact so that the central zone completely covers the cavity of the substrate, and of sealing by melting of the glass.

12. Fabrication process according to claim 11, comprising a selective etching stage of the rear face of the cover between the third and fourth stages so that the glass contained in the groove is salient.

13. Fabrication process according to claim 8, wherein bringing the substrate and cover into contact is achieved by applying an electrical voltage between the substrate and cover.

14. Fabrication process according to claim 8, comprising, in the first stage, machining, in the rear face of the cover, of a hole having a depth smaller than the thickness of the cover, and a stage of thinning the front face of the cover after the sealing stage.

15. Fabrication process according to claim 8, comprising, before the stage of bringing the substrate and cover into contact, a stage of making a channel in the rear face of the cover locally preventing complete plugging by the sealing material during the sealing stage, enabling subsequent sealing in a controlled atmosphere.

16. Fabrication process according to claim 8, comprising a stage of making a hole in the cover enabling subsequent sealing in a controlled atmosphere.

* * * * *